US009978877B2

(12) United States Patent
Matsumoto et al.

(10) Patent No.: US 9,978,877 B2
(45) Date of Patent: May 22, 2018

(54) ELECTROCONDUCTIVE THIN FILM, COATING LIQUID FOR FORMING ELECTROCONDUCTIVE THIN FILM, FIELD-EFFECT TRANSISTOR, AND METHOD FOR PRODUCING FIELD-EFFECT TRANSISTOR

(71) Applicants: Shinji Matsumoto, Kanagawa (JP); Naoyuki Ueda, Kanagawa (JP); Yuki Nakamura, Tokyo (JP); Yukiko Abe, Kanagawa (JP); Mikiko Takada, Kanagawa (JP); Yuji Sone, Kanagawa (JP); Ryoichi Saotome, Kanagawa (JP)

(72) Inventors: Shinji Matsumoto, Kanagawa (JP); Naoyuki Ueda, Kanagawa (JP); Yuki Nakamura, Tokyo (JP); Yukiko Abe, Kanagawa (JP); Mikiko Takada, Kanagawa (JP); Yuji Sone, Kanagawa (JP); Ryoichi Saotome, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days. days.

(21) Appl. No.: 14/382,604

(22) PCT Filed: Mar. 14, 2013

(86) PCT No.: PCT/JP2013/058199
§ 371 (c)(1),
(2) Date: Sep. 3, 2014

(87) PCT Pub. No.: WO2013/141330
PCT Pub. Date: Sep. 26, 2013

(65) Prior Publication Data
US 2015/0028334 A1    Jan. 29, 2015

(30) Foreign Application Priority Data
Mar. 19, 2012  (JP) .................................. 2012-062117
Mar. 7, 2013   (JP) .................................. 2013-044888

(51) Int. Cl.
*H01L 29/10*    (2006.01)
*H01L 29/786*   (2006.01)
(Continued)

(52) U.S. Cl.
CPC ........ *H01L 29/7869* (2013.01); *H01L 21/445* (2013.01); *H01L 23/5328* (2013.01);
(Continued)

(58) Field of Classification Search
CPC ............. H01L 23/5328; H01L 29/7869; H01L 29/458; H01L 29/45; H01L 21/445; H01L 27/1292
See application file for complete search history.

(56) References Cited

U.S. PATENT DOCUMENTS 6,471,889 B1    10/2002  Hayashi et al.
6,830,823 B1 *  12/2004  Kodas ..................... B01J 2/003
                                                257/E21.304
(Continued)

FOREIGN PATENT DOCUMENTS

CN    1306046 A    8/2001
EP    0753762 A1   1/1997
(Continued)

OTHER PUBLICATIONS

International Search Report Issued for counterpart International Patent Application No. PCT/JP2013/058199 dated Jun. 11, 2013.
(Continued)

*Primary Examiner* — Shaun Campbell
(74) *Attorney, Agent, or Firm* — Cooper & Dunham LLP (57) ABSTRACT

To provide an electroconductive thin film, containing: a metal oxide containing indium and tin; and gold.

5 Claims, 4 Drawing Sheets

(51) Int. Cl.
  H01L 23/532  (2006.01)
  H01L 21/445  (2006.01)
  H01L 29/45   (2006.01)
  H01L 27/12   (2006.01)
(52) U.S. Cl.
  CPC .......... H01L 27/1292 (2013.01); H01L 29/45 (2013.01); H01L 29/458 (2013.01); *H01L 2924/0002* (2013.01)

(56) References Cited

U.S. PATENT DOCUMENTS

| | | |
|---|---|---|
| 2001/0032968 A1 | 10/2001 | Yukinobu et al. |
| 2002/0185632 A1* | 12/2002 | Hayashi et al. ........... 252/520.1 |
| 2004/0232827 A1 | 11/2004 | Ueno et al. |
| 2006/0258068 A1 | 11/2006 | Moriya et al. |
| 2009/0001432 A1 | 1/2009 | Kim et al. |
| 2009/0212291 A1 | 8/2009 | Ikeda |
| 2010/0032667 A1 | 2/2010 | Yamazaki et al. |
| 2010/0140613 A1 | 6/2010 | Kimura |
| 2010/0289997 A1 | 11/2010 | Suzuki |
| 2011/0128275 A1 | 6/2011 | Ueda et al. |
| 2012/0056173 A1 | 3/2012 | Pieralisi |

FOREIGN PATENT DOCUMENTS

| | | |
|---|---|---|
| EP | 2426720 A1 | 3/2012 |
| JP | 11-228872 | 8/1999 |
| JP | 2001-332123 | 11/2001 |
| JP | 4389368 | 12/2009 |
| JP | 2010-062546 | 3/2010 |
| JP | 2010-074148 | 4/2010 |
| JP | 2010-098280 | 4/2010 |
| JP | 2010-156963 | 7/2010 |
| JP | 2011-35376 | 2/2011 |
| JP | 4880951 | 12/2011 |
| JP | 2012-015357 | 1/2012 |

OTHER PUBLICATIONS

Feb. 3, 2015 European search report in corresponding European patent application No. 13763600.7.

H. Guo et al., "Au-Doped Indium Tin Oxide Ohmic Contacts to p-Type GaN", Journal of Electronic Materials, Mar. 9, 2010, pp. 494-498, vol. 39(5).

J. Robertson et al., "Electronic Structure of Transparent Conducting Oxides", Handbook of Transparent Conductors, Jan. 1, 2011, pp. 27-50, Springer, Boston, US.

A. Klein et al., "Transparent Conducting Oxides for Photovoltaics: Manipulation of Fermi Level, Work Function and Energy Band Alignment", materials, Nov. 2, 2010, pp. 4892-4914, vol. 3(11).

D. Kim, "Low temperature deposition of transparent conducting ITO/Au/ITO films by reactive magnetron sputtering", Applied Surface Science, Jan. 1, 2010, pp. 1774-1777, vol. 256 (6), Elsevier, Amsterdam, NL.

S. Katusic et al., "Production and characterization of ITO-Pt semiconductor powder containing nanoscale noble metal particles catalytically active in Dye-Sensitized Solar Cells", Solar Energy Materials and Solar Cells, Aug. 15, 2006, pp. 1983-1999, vol. 90(13), Elsevier, Amsterdam, NL.

Korean official action dated Sep. 16, 2015 (and English translation thereof) in corresponding Korean Patent Application No. 10-2014-7027310.

Aug. 9, 2016 Japanese official action in corresponding Japanese Patent Application No. 2013-044888.

Chinese Office Action dated May 5, 2016 (with English translation) in connection with corresponding Chinese patent application No. 201380015030.3.

Korean Office Action dated May 13, 2016 (and English translation) in connection with corresponding Korean patent application No. 10-2014-7027310.

Chinese official action dated Jan. 13, 2017 (with English translation) in connection with corresponding Chinese patent application No. 201380015030.3.

* cited by examiner

ELECTROCONDUCTIVE THIN FILM, COATING LIQUID FOR FORMING ELECTROCONDUCTIVE THIN FILM, FIELD-EFFECT TRANSISTOR, AND METHOD FOR PRODUCING FIELD-EFFECT TRANSISTOR

TECHNICAL FIELD

The present invention relates to an electroconductive thin film, a coating liquid for forming an electroconductive thin film, a field-effect transistor, and a method for producing a field-effect transistor.

BACKGROUND ART

Recently, an active matrix display device (e.g., a liquid display device, a luminescent display device, and an electrophoretic display device), in which a switching element formed of a thin film field-effect transistor (FET) is provided in each of display image elements arranged in a matrix form, has been actively developed.

In these developments, attentions have been paid on techniques for forming FET using an oxide semiconductor film, which has high carrier mobility, and less variation between elements, in a channel forming region of the FET, and applying such FET to an electron device, an optical device, etc. For example, proposed is FET using, as an oxide semiconductor film, zinc oxide (ZnO), $In_2O_3$, In—Ga—Zn—O, etc.

There are currently needs for display devices having large display areas. In a display device for displaying in a large area, a problem of signal delay due to resistance occurred from the wiring to a channel of the FET becomes significant. Therefore, in production of FET, materials having low resistivity are ideally used as materials of wiring, source electrode, and drain electrode. Examples of such materials include metal.

In the case where FET has a structure in which a source electrode and drain electrode both formed of metal having low resistivity are directly in contact with an oxide semiconductor film, contact resistance thereof increases. It has been considered that one of the factors for increasing the contact resistance is formation of Schottkey barrier junction on a contact surface of the oxide semiconductor film with the source electrode and drain electrode.

Therefore, it is desired to provide an electrode having low resistivity, and form an excellent electrical connection with an oxide semiconductor film.

In order to solve the aforementioned problems, disclosed is a method for providing a buffer layer for forming ohmic contact between a source electrode and drain electrode, and an oxide semiconductor layer, and using metal having low resistance for the electrodes (see PTL 1). In accordance with the disclosed method, FET having excellent properties can be produced. However, as this method requires a buffer layer, a number of the production processes of the FET increases.

Moreover, disclosed is FET using electroconductive oxide, such as thin-doped indium oxide (ITO), and zinc-doped indium oxide (IZO), for a source electrode and drain electrode, and using oxide semiconductor for an active layer (see PTLs 2 and 3). However, the resistivity of the electroconductive oxide is generally higher than that of metal. Therefore, the disclosed technique cannot achieve both low resistivity and excellent electrical connection with an oxide semiconductor film.

Accordingly, there are currently needs for an electroconductive thin film having low resistivity, and is capable of forming an excellent electric connection with an oxide semiconductor film without increasing stages of a production process.

CITATION LIST

Patent Literature

PTL 1: Japanese Patent Application Laid-Open (JP-A) No. 2010-62546
PTL 2: JP-A No. 2010-156963
PTL 3: JP-A No. 2010-98280

SUMMARY OF INVENTION

Technical Problem

The present invention aims to solve the aforementioned various problems in the art and to achieve the following object. An object of the present invention is to provide an electroconductive thin film having low resistivity, and is capable of forming an excellent electric connection with an oxide semiconductor film without increasing stages of a production process.

Solution to Problem

The means for solving the aforementioned problems are as follows:

An electroconductive film of the present invention contains:
a metal oxide containing indium and tin; and
gold.

Advantageous Effects of Invention

The present invention can solve the aforementioned various problems in the art and can provide an electroconductive thin film having low resistivity, and is capable of forming an excellent electric connection with an oxide semiconductor film without increasing stages of a production process.

DESCRIPTION OF EMBODIMENTS (Electroconductive Thin Film)

The electroconductive thin film of the present invention contains at least a metal oxide, which contains indium and tin, and gold, and may further contain other components, if necessary.

<Metal Oxide>

The metal oxide is appropriately selected depending on the intended purpose without any limitation, provided that it contains indium and tin, but it is preferably indium tin oxide (ITO) because ITO has relatively high electroconductivity.

A ratio of the indium and the tin is appropriately selected depending on the intended purpose without any limitation, but a ratio of the number of atoms of the tin to the number of atoms of the indium, i.e., [tin(B)/indium(A)] is preferably 0.01 to 0.25, more preferably 0.05 to 0.15.

When the [tin(B)/indium(A)] is within the aforementioned preferable range, electroconductivity of the metal oxide can be kept low. When the [tin(B)/indium(A)] is within the aforementioned more preferable range, the effect thereof becomes more significant.

A shape of the metal oxide is appropriately selected depending on the intended purpose without any limitation, but it is preferably a particulate shape.

In the case where the shape of the metal oxide is a particulate shape, the average particle diameter of the particles thereof is appropriately selected depending on the intended purpose without any limitation. However, the upper limit thereof is preferably 1 µm or smaller, more preferably 500 nm or smaller, and even more preferably 100 nm or smaller. The lower limit thereof is preferably 1 nm or greater, more preferably 5 nm or greater, and even more preferably 10 nm or greater.

The average particle diameter of each type of particles in the electroconductive thin film can be measured, for example, by means of a scanning electron microscope. A cross section of the electroconductive thin film is observed under a scanning electron microscope, and particle diameters of 100 gold particles on the cross section of the electroconductive thin film are measured. The average value of the measured particle diameters is determined as the average particle diameter. Note that, in the case where the particles are spherical, a diameter thereof is measured as a particle diameter. In the case where particles have irregular shapes, the average value of the maximum diameter and the minimum diameter is determined as a particle diameter.

<Gold>

The gold is appropriately selected depending on the intended purpose without any limitation.

A shape of the gold is appropriately selected depending on the intended purpose without any limitation, and examples thereof include spherical, oblate, and polyhedron. Among them, the spherical shape is preferable. Note that, the spherical shape is not limited to a sphere.

The average particle diameter of the gold is appropriately selected depending on the intended purpose without any limitation, but the upper limit thereof is preferably 1 µm or smaller, more preferably 500 nm or smaller, and even more preferably 100 nm or smaller. The lower limit thereof is preferably 1 nm or greater, more preferably 5 nm or greater, and even more preferably 10 nm or greater.

In the case where the electroconductive thin film is used for a source electrode and drain electrode of a transistor having a small device size, a contact area of a semiconductor with the electrode is in a width of several micrometers to several tens micrometers. As a result that the metal oxide and the gold have the sizes in the aforementioned ranges (e.g., 1 nm to 1 µm), the metal oxide in the electroconductive thin film and a semiconductor are brought into contact with each other substantially uniformly, and therefore homogenization of electric properties can be expected.

The number (A) of atoms of indium, the number (B) of atoms of tin, and the number (C) of atoms of gold in the electroconductive thin film are appropriately selected depending on the intended purpose without any limitation, but a ratio [C/(A+B+C)] of (A), (B), and (C) is preferably 0.21 to 0.78, i.e., (A), (B), and (C) satisfy the following formula (1), because extremely low resistivity can be obtained, and excellent electrical connection with an oxide semiconductor film can be achieved.

$$0.21 \leq [C/(A+B+C)] \leq 0.78 \quad \text{Formula (1)}$$

When the ratio [C/(A+B+C)] is less than 0.21, the resistivity of the electroconductive thin film is not much different from the resistivity of the metal oxide that is a component for the electroconductive thin film, and the resistivity of the electroconductive thin film may be remained high. When the ratio [C/(A+B+C)] is more than 0.78, an electrical connection with an oxide semiconductor film may be impaired.

The electrical connection is contact resistance when the electroconductive thin film is brought into contact with an oxide semiconductor film. The contact resistance of the electroconductive thin film is small.

The ratio [C/(A+B+C)] is preferably 0.21 or more, more preferably 0.28 or more.

When the ratio [C/(A+B+C)] is 0.21 or more, a resistivity of the electroconductive thin film is significantly reduced. This is probably because resistivity of the electroconductive thin film is reduced as a whole, as an electroconductive channel formed of gold particles having low resistivity is formed in the electroconductive thin film, which can be explained by the percolation theory. In the percolation theory, the exhibition of electroconductivity of a composite material composed of an insulating material and an electroconductive material is explained by that clusters connected through the entire system are formed when the concentration of the electroconductive material exceeds a certain level (threshold). In order to form such clusters connected through the entire system, the ratio (concentration) of the electroconductive material needs to be a certain level or greater, and the minimum value of such ratio (concentration) is called the percolation threshold. Accordingly, by giving the concentration of the gold particles having low resistivity in the electroconductive thin film exceeding the percolation threshold, electroconduction due to the gold particles starts to work dominantly over the electric resistance of the electroconductive thin film, and therefore the resistance of the electroconductive thin film as a whole can be kept sufficiently low.

The ratio [C/(A+B+C)] is preferably 0.78 or less, more preferably 0.61 or less.

In order to form excellent electrical connection with n-type oxide semiconductor, it is generally preferred that the work function of the electrode material be small. The measurement of the work function can be performed, for example, by an atmospheric photoelectron spectroscopic device AC-2 (manufactured by Riken Keiki Co., Ltd.). Since the work function of the metal oxide is relatively small, the metal oxide tends to easily form an ohmic contact with n-type oxide semiconductor. As the work function of the gold is relatively large, on the other hand, the gold tends to easily form the Schottky barrier junction with n-type oxide semiconductor, which may increase contact resistance.

When the ratio [C/(A+B+C)] is greater than 0.78, the gold may be present on a connection interface between the electroconductive thin film and oxide semiconductor. When the ratio [C/(A+B+C)] is 0.78 or less, however, the metal oxide present in the electroconductive thin film contributes to the electrical connection with oxide semiconductor, and therefore the electroconductive thin film and the oxide semiconductor can substantially form an ohmic contact. In the case where the electroconductive thin film is used for a source electrode and drain electrode of a thin film field-effect transistor (FET), therefore, it is possible to keep the contact resistance low, and excellent current-voltage properties can be attained.

When the ratio [C/(A+B+C)] is greater than 0.78, a majority of a surface of the electroconductive thin film may be occupied with gold having low resistivity. In such case, a contact interface between the electroconductive thin film and oxide semiconductor is dominated with Schottky barrier junction. When the aforementioned area of the electroconductive thin film is used as a source electrode and drain electrode of FET, therefore, contact resistance is high, and therefore it is difficult to attain excellent current-voltage properties.

Figure 1A:
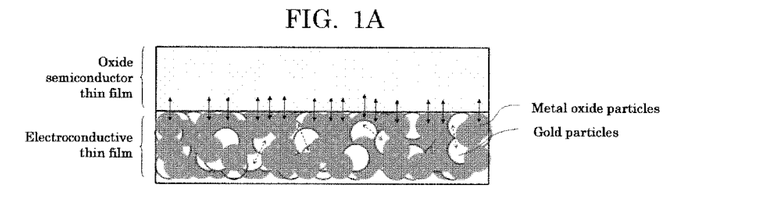
FIG. 1A is an explanatory diagram illustrating electric connection in an electroconductive thin film and at an interface between the electroconductive thin film and an oxide semiconductor thin film (part 1).
Figure 1B:
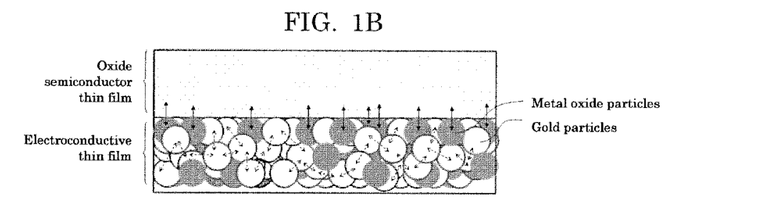
FIG. 1B is an explanatory diagram illustrating electric connection in an electroconductive thin film and at an interface between the electroconductive thin film and an oxide semiconductor thin film (part 2).
Figure 1C:
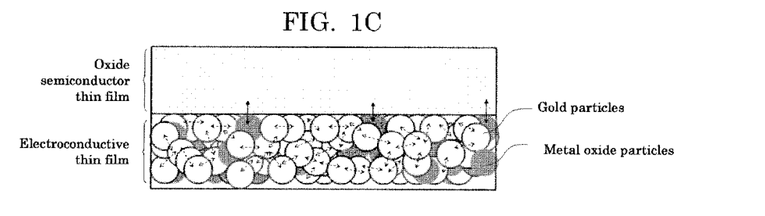
FIG. 1C is an explanatory diagram illustrating electric connection in an electroconductive thin film and at an interface between the electroconductive thin film and an oxide semiconductor thin film (part 3).

With reference to FIGS. 1A to 1C, next will be described in detail electric connection in the electroconductive thin film and at an interface between the electroconductive thin film and the oxide semiconductor thin film.

The solid arrows in FIGS. 1A to 1C indicate portions having low contact resistance where an ohmic contact is formed between the oxide semiconductor thin film and metal oxide particles contained in the electroconductive thin film. The dashed arrows in FIGS. 1A to 1C indicate portions having low resistance between gold particles in contact with each other in the electroconductive thin film. FIG. 1A schematically illustrates a case where the ratio [C/(A+B+C)] is less than 0.21. FIG. 1B schematically illustrates a case where the ratio [C/(A+B+C)] is 0.21 or more but 0.78 or less. FIG. 1C schematically illustrates a case where the ratio [C/(A+B+C)] is more than 0.78. When the electroconductive thin film is in the state of FIG. 1A, a large number of portions form an ohmic contact between the oxide semiconductor thin film and the metal oxide particles contained in the electroconductive thin film and thus the contact resistance between the electroconductive thin film and the oxide semiconductor thin film becomes low. However, the gold particles contained in the electroconductive thin film are not in contact with each other throughout the electroconductive thin film and thus the resistance of the electroconductive thin film becomes high. When the electroconductive thin film is in the state of FIG. 1C, the gold particles contained in the electroconductive thin film are in contact with each other throughout the electroconductive thin film and thus the resistance of the electroconductive thin film becomes low. However, a small number of portions form an ohmic contact between the electroconductive thin film and the oxide semiconductor thin film and thus the contact resistance between the electroconductive thin film and the oxide semiconductor thin film becomes high. When the electroconductive thin film is in the state of FIG. 1B, a large number of portions form an ohmic contact between the electroconductive thin film and the oxide semiconductor thin film and the gold particles contained in the electroconductive thin film are in contact with each other throughout the electroconductive thin film. As a result, the contact resistance between the electroconductive thin film and the oxide semiconductor thin film is low and the resistance of the electroconductive thin film itself is low. In FETs, the lower the resistances of a source electrode and a drain electrode and the resistance at an interface between each of the electrodes and semiconductor are, the better current-voltage properties can be. Therefore, when the electroconductive thin film of the present invention is used as an electrode forming an ohmic contact with the oxide semiconductor thin film, FETs can be improved in device performances. Especially when the electroconductive thin film is in the state of FIG. 1B, FETs can be improved more in device performances.

As mentioned above, it can be understood that an electroconductive thin film having low resistivity, and excellent electrical connection with n-type oxide semiconductor can be obtained by satisfying the formula (1).

By selecting gold, which is hardly oxidized, as metal contributing to reduce resistivity, the resistivity of the electroconductive thin film can be maintained low even when the electroconductive thin film is formed through a process performed in an oxidizing atmosphere, or a high temperature process.

The electroconductive thin film is preferably an electroconductive thin film obtained by applying, on a support, the below-mentioned coating liquid for forming an electroconductive thin film of the present invention; drying the applied coating liquid, and baking the dried coating liquid, because an electroconductive thin film can be easily obtained, and an electroconductive thin film having a large area can be obtained.

A shape of the electroconductive thin film is appropriately selected depending on the intended purpose without any limitation, and examples thereof include a plate, a line, and a patterned shape.

A size of the electroconductive thin film is appropriately selected depending on the intended purpose without any limitation.

A structure of the electroconductive thin film is appropriately selected depending on the intended purpose without any limitation, but it is preferred that the gold is dispersed in a thin film formed of the metal oxide. Such structure can be easily obtained by applying the below-mentioned coating liquid for forming an electroconductive thin film of the present invention onto a support, drying and then baking the applied coating liquid.

The average thickness of the electroconductive thin film is appropriately selected depending on the intended purpose without any limitation, but it is preferably 40 nm to 2 μm, more preferably 70 nm to 1 μm.

The average thickness can be determined by measuring a thickness of the electroconductive thin film at randomly selected 4 points thereon by means of an atomic force microscope (Nano-Im, manufactured by Pacific Nanotechnology, Inc.), and calculating an average value of the measured values.

<Production Method of Electroconductive Thin Film>

A production method of the electroconductive thin film is appropriately selected depending on the intended purpose without any limitation, and examples thereof include: a dry process, such as sputtering; and a wet process using a coating method, such as screen printing, roll coating, dip coating, spin coating, inkjet printing, and nano printing. Particularly, a droplet coating method represented by an inkjet printing is preferable because an electroconductive thin film can be easily obtained, and an electroconductive thin film having a large area can be obtained.

In the case where the electroconductive thin film is formed by the coating method, the electroconductive thin film can be obtained by preparing a coating liquid for forming an electroconductive thin film, applying the coating liquid for forming an electroconductive thin film onto a support, drying and then baking. As for the coating liquid for forming an electroconductive thin film, for example, the below-mentioned the coating liquid for forming an electroconductive thin film of the present invention is preferable.

The support is appropriately selected depending on the intended purpose without any limitation, and examples thereof include a glass substrate, and a plastic substrate.

In the case where the electroconductive thin film is used as a source electrode and drain electrode of a field-effect transistor using oxide semiconductor, examples of the support include a substrate, a gate insulating layer, and a semiconductive layer (active layer). A shape, structure and size of the substrate are appropriately selected depending on the intended purpose without any limitation. A material of the substrate is appropriately selected depending on the intended purpose without any limitation, and examples thereof include a glass substrate, and a plastic substrate.

When the coating is performed by inkjet printing or nano printing as the coating method, the coating can be performed at room temperature. However, the support is preferably heated to about 30° C. to about 100° C., the coating liquid for forming an electroconductive thin film just after deposited on a surface of the support can be prevented from wetting and spreading.

The drying is appropriately selected depending on the intended purpose without any limitation, provided that it is performed under the conditions by which volatile components on the coating liquid for forming an electroconductive thin film can be removed. Note that, it is not necessary to completely remove the volatile components during the drying, and the volatile components may be removed in an enough amount with which baking is not adversely affected.

The temperature of the baking is appropriately selected depending on the intended purpose without any limitation, provided that it is temperature equal to or higher than temperature at which the metal oxide (the metal oxide containing indium and thin), which is a main component of the electroconductive thin film, is formed, and equal to or lower than the deformation temperature of the support. The temperature of the baking is preferably 250° C. to 600° C.

The atmosphere for the baking is appropriately selected depending on the intended purpose without any limitation, and examples thereof include atmosphere including oxygen, such as in oxygen gas, and in atmosphere. Moreover, the atmosphere of the baking may be inert gas, such as nitrogen gas.

By performing an annealing treatment in the atmosphere, inert gas, or reducing gas after the baking, the electric properties, reliability, and uniformity of the electroconductive thin film can be further improved.

The duration for the baking is appropriately selected depending on the intended purpose without any limitation.

The electroconductive thin film has low resistivity, and can realize excellent electrical connection with an oxide semiconductor film, and therefore the electroconductive thin film can be suitably used for a source electrode and drain electrode of a field-effect transistor.

A quantitative analysis of each element contained in the electroconductive thin film can be performed by X-ray fluorescence spectroscopy in which X-rays are used for excitation of an inner-shell electron, and characteristic X-rays (fluorescent X-rays) emitted from a sample are measured. Therefore, a ratio of the numbers of atoms of elements contained in the electroconductive thin film can be determined by X-ray fluorescence spectroscopy.

When an X-ray absorption spectrum of a material is measured, a spectrum having a discontinuous section is obtained, and the energy for causing this discontinuity is called an absorption edge. The absorption edge energy is regarded as the minimum energy required for emitting the fluorescent X-ray of the sequence (K, L, . . . ) thereof.

A void is formed in an inner shell of an atom by X-rays having the energy equal to or greater than the absorption edge, and then an electron is transferred from an outer shell. The energy difference as caused is emitted as a fluorescent X-ray. As the energy of the inner shell is due to an element, a wavelength of the fluorescent X-ray is also unique to the element. Therefore, by experimentally determining a wavelength of a fluorescent X-ray of a measuring sample, elements constituting the measuring sample can be analyzed.

(Coating Liquid for Forming an Electroconductive Thin Film)

The coating liquid for forming an electroconductive thin film of the present invention contains at least gold, and a combination of indium and tin, a metal oxide containing indium and tin, a combination of indium oxide and tin oxide, or any combination thereof, and may further contain other components, such as an organic solvent, if necessary.

Examples of the coating liquid for forming an electroconductive thin film include: a coating liquid containing indium, tin, gold, and an organic solvent; a coating liquid containing gold, a metal oxide containing indium and tin, and organic solvent; and a coating liquid containing indium oxide, tin oxide, gold, and an organic solvent.

<Metal Oxide>

The metal oxide is appropriately selected depending on the intended purpose without any limitation, provided that it contains indium and tin, but it is preferably indium tin oxide (ITO) because ITO has relatively high electroconductivity.

A ratio of the indium and the tin is appropriately selected depending on the intended purpose without any limitation, but a ratio of the number of atoms of the tin to the number of atoms of the indium, i.e., [tin(B)/indium(A)] is preferably 0.01 to 0.25, more preferably 0.05 to 0.15.

When the [tin(B)/indium(A)] is within the aforementioned preferable range, electroconductivity of the metal oxide can be kept low. When the [tin(B)/indium(A)] is within the aforementioned more preferable range, the effect thereof becomes more significant.

A shape of the metal oxide is appropriately selected depending on the intended purpose without any limitation, and examples thereof include spherical, oblate, and polyhedron. Among them, the spherical shape is preferable. Note that, the spherical shape is not limited to a sphere.

The average particle diameter of the metal oxide is appropriately selected depending on the intended purpose without any limitation, but the upper limit thereof is preferably 1 μm or smaller, more preferably 100 nm or smaller, and even more preferably 50 nm or smaller. The lower limit thereof is preferably 1 nm greater, more preferably 5 nm or greater, and even more preferably 10 nm or greater.

The average particle diameter of each type of particles in the coating liquid for forming an electroconductive thin film can be measured, for example, by means of a scanning electron microscope.

The metal oxide may be selected from commercial products. Examples of the commercial products thereof include ITO nano particle dispersion liquid (of Tomoe Works Co., Ltd., average particle diameter: 20 nm, metal content: 10.1% by mass).

<Indium Oxide and Tin Oxide>

The indium oxide and tin oxide are formed into a metal oxide containing indium and tin, e.g., indium tin oxide (ITO) by applying, onto a support, the coating liquid for forming an electroconductive thin film, drying, and then baking.

A ratio of the indium and the tin is appropriately selected depending on the intended purpose without any limitation, but a ratio of the number of atoms of the tin to the number of atoms of the indium, i.e., [tin(B)/indium(A)] is preferably 0.01 to 0.25, more preferably 0.05 to 0.15.

When the [tin(B)/indium(A)] is within the aforementioned preferable range, electroconductivity of the metal oxide can be kept low. When the [tin(B)/indium(A)] is within the aforementioned more preferable range, the effect thereof becomes more significant.

<Gold>

The gold is appropriately selected depending on the intended purpose without any limitation.

A shape of the gold is appropriately selected depending on the intended purpose without any limitation, and examples thereof include spherical, oblate, and polyhedron. Among them, the spherical shape is preferable. Note that, the spherical shape is not limited to a sphere.

The average particle diameter of the gold is appropriately selected depending on the intended purpose without any limitation, but the upper limit thereof is preferably 1 μm or smaller, more preferably 100 nm or smaller, and even more preferably 50 nm or smaller. The lower limit thereof is preferably 1 nm or greater, more preferably 5 nm or greater, and even more preferably 10 nm or greater.

The gold may be selected from commercial products. Examples of the commercial products thereof include Au-1Cden manufactured by ULVAC Materials Co., Ltd. (average particle diameter: 5 nm, metal content: 51% by mass), and NPG-J manufactured by Harima Chemicals Group, Inc. (average particle diameter: 7 nm, metal content: 57.5% by mass).

It has been known that metal nano particles having the average particle diameters of several nanometers to several tens nanometers are sintered at temperature that is significantly lower than the melting point thereof. When the average particle diameter is in the aforementioned range, therefore, it can be expected that sintering temperature is lowered. In the case where an electroconductive thin film is formed by a droplet coating method, such as inkjet printing, moreover, the small average particle diameter is effective for preventing clogging of a nozzle.

The number (A) of atoms of indium, the number (B) of atoms of tin, and the number (C) of atoms of gold in the coating liquid for forming an electroconductive thin film are appropriately selected depending on the intended purpose without any limitation, but a ratio [C/(A+B+C)] of (A), (B), and (C) is preferably 0.21 to 0.78, i.e., (A), (B), and (C) satisfy the following formula (1), because extremely low resistivity can be obtained, and excellent electrical connection with an oxide semiconductor film can be achieved.

$$0.21 \leq [C/(A+B+C)] \leq 0.78 \qquad \text{Formula (1)}$$

The preferable range, more preferable range, and reasons thereof are the same as the ones described in the descriptions for the electroconductive thin film.

<Organic Solvent>

The organic solvent is appropriately selected depending on the intended purpose without any limitation, and examples thereof include: hydrocarbon, such as tetradecane; cyclic hydrocarbon, such as cyclohexane, and cyclododecane; and aromatic hydrocarbon, such as toluene, xylene, and mesitylene. These may be used alone, or in combination.

An amount of the organic solvent in the coating liquid for forming an electroconductive thin film is appropriately selected depending on the intended purpose without any limitation, but it is preferably 40% by mass to 90% by mass, more preferably 50% by mass to 85% by mass. When the amount thereof is smaller than 40% by mass, the dispersed particles may be precipitated. When the amount thereof is greater than 90% by mass, a concentration of the particles is excessively low, and therefore a sufficient film thickness may not be attained. When the amount thereof is within the aforementioned more preferable range, the dispersed particles are not easily precipitated, and the intended film thickness can be easily obtained.

The coating liquid for forming an electroconductive thin film of the present invention is suitable as a coating liquid for formation of the electroconductive thin film of the present invention. Especially, the coating liquid for forming an electroconductive thin film satisfying the aforementioned formula (1) is suitable as a coating liquid for formation of a source electrode and drain electrode of a field-effect transistor.

(Field-Effect Transistor)

The field-effect transistor of the present invention contains at least a gate electrode, a source electrode, a drain electrode, an active layer, and a gate insulating layer, and may further contain other members, if necessary.

The field-effect transistor of the present invention can be produced, for example, by the method for producing a field-effect transistor of the present invention.

<Gate Electrode>

The gate electrode is appropriately selected depending on the intended purpose without any limitation, provided that it is an electrode for applying gate voltage.

A material of the gate electrode is appropriately selected depending on the intended purpose without any limitation, and examples thereof include: metal, such as platinum, palladium, gold, silver, copper, zinc, aluminum, nickel, chromium, tantalum, molybdenum, and titanium; an alloy of any of the above-listed metals; and a mixture of any of the above-listed metals. Other examples thereof include: electroconductive oxide, such as indium oxide, zinc oxide, tin oxide, gallium oxide, and niobium oxide; a composite compound of any of the above-listed oxide; and a mixture of any of the above-listed oxide.

The average thickness of the gate electrode is appropriately selected depending on the intended purpose without any limitation, but it is preferably 40 nm to 2 μm, more preferably 70 nm to 1 μm.

<Gate Insulating Layer>

The gate insulating layer is appropriately selected depending on the intended purpose without any limitation, provided that it is an insulating layer formed between the gate electrode and the active layer.

A material of the gate insulating layer is appropriately selected depending on the intended purpose without any limitation, and examples thereof include an inorganic insulating material, and an organic insulating material.

Examples of the inorganic insulating material include silicon oxide, aluminum oxide, tantalum oxide, titanium oxide, yttrium oxide, lanthanum oxide, hafnium oxide, zirconium oxide, silicon nitride, aluminum nitride, and a mixture of any of the above-listed materials.

Examples of the organic insulating material include polyimide, polyamide, polyacrylate, polyvinyl alcohol, and a novolak resin.

A thickness of the gate insulating layer is appropriately selected depending on the intended purpose without any limitation, but it is preferably 50 nm to 3 μm, more preferably 100 nm to 1 μm.

<Source Electrode and Drain Electrode>

The source electrode and drain electrode are electrodes for extracting electric current, and are formed of the electroconductive thin film of the present invention.

The average thickness of each of the source electrode and the drain electrode is appropriately selected depending on the intended purpose without any limitation, but it is preferably 40 nm to 2 μm, more preferably 70 nm to 1 μm.

<Active Layer>

The active layers appropriately selected depending on the intended purpose without any limitation, provided that it is an active layer, which is formed of oxide semiconductor, and is formed between the source electrode and the drain electrode.

Examples of the oxide semiconductor include n-type oxide semiconductor.

Examples of the n-type oxide semiconductor include In—Mg oxide semiconductor, and In—Zn oxide semiconductor.

The average thickness of the active layer is appropriately selected depending on the intended purpose without any limitation, but it is preferably 1 nm to 200 μm, more preferably 5 nm to 100 μm.

Figure 2:
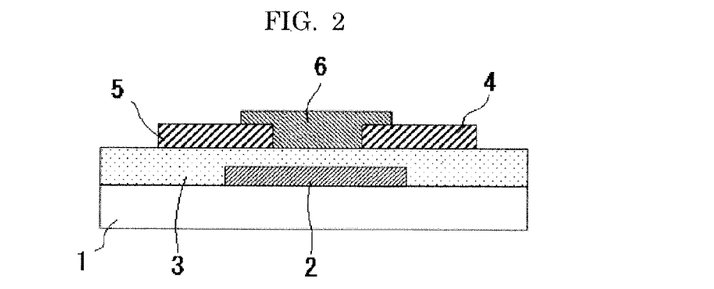
FIG. 2 is a schematic cross-sectional diagram illustrating one example of a bottom gate and bottom contact field-effect transistor.
Figure 3:
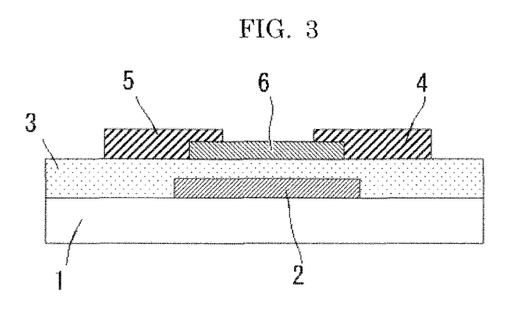
FIG. 3 is a schematic cross-sectional diagram illustrating one example of a bottom gate and top contact field-effect transistor.
Figure 4:
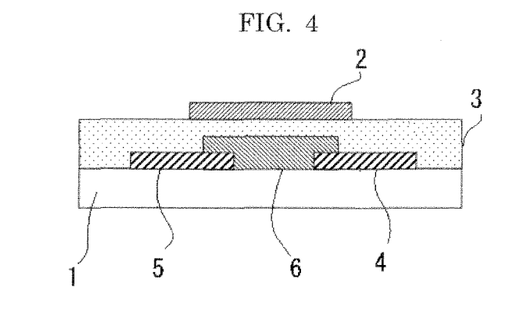
FIG. 4 is a schematic cross-sectional diagram illustrating one example of a top gate and bottom contact field-effect transistor.
Figure 5:
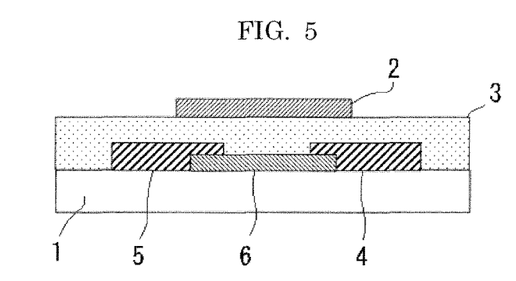
FIG. 5 is a schematic cross-sectional diagram illustrating one example of a top gate and top contact field-effect transistor.

A structure of the field-effect transistor is appropriately selected depending on the intended purpose without any limitation, and examples thereof include bottom-gate and bottom-contact (FIG. 2), bottom-gate and top-contact (FIG. 3), top-gate and bottom-contact (FIG. 4), and top-gate and top-contact (FIG. 5).

Note that, in FIGS. 2 to 5, "1" is a substrate, "2" is a gate electrode, "3" is a gate insulating layer, "4" is a source electrode, "5" is a drain electrode, and "6" is an active layer.

The field-effect transistor of the present invention can be suitably used as a field-effect transistor for a pixel driving circuit and logic circuit, such as a liquid crystal display, an organic EL display, and an electrochromic display.

(Method for Producing Field-Effect Transistor)

The method for producing a field-effect transistor (first production method) of the present invention contains: forming a gate electrode on a substrate; forming a gate insulating layer on the gate electrode; forming, on the gate insulating layer, a source electrode and a drain electrode in a manner that the source electrode and the drain electrode are apart from each other; and forming an active layer formed of oxide semiconductor in an area on the gate insulating layer which is a channel region between the source electrode and the drain electrode.

Moreover, the method for producing a field-effect transistor (second production method) of the present invention contains: forming, on a substrate, a source electrode and a drain electrode in a manner that the source electrode and the drain electrode are apart from each other; forming an active layer formed of oxide semiconductor in an area on the substrate which is a channel region between the source electrode and the drain electrode; forming a gate insulating layer on the active layer; and forming a gate electrode on the gate insulating layer.

<First Production Method>

The first production method will be explained hereinafter.

—Substrate—

A shape, structure and size of the substrate are appropriately selected depending on the intended purpose without any limitation.

A material of the substrate is appropriately selected depending on the intended purpose without any limitation, and examples thereof include a glass substrate, and a plastic substrate.

The glass substrate is appropriately selected depending on the intended purpose without any limitation, and examples thereof include non-alkali glass, and silica glass.

The plastic substrate is appropriately selected depending on the intended purpose without any limitation, and examples thereof include polycarbonate (PC), polyimide (PI), polyethylene terephthalate (PET), and polyethylene naphthalate (PEN).

Note that, the substrate is preferably subjected to a pretreatment, such as oxygen plasma, UV ozone, and UV radiation washing, in order to clean a surface thereof and to improve adhesion with another layer.

—Formation of Gate Electrode—

The formation of a gate electrode is appropriately selected depending on the intended purpose without any limitation, provided that it contains forming a gate electrode on the substrate, and examples thereof include: (i) forming a film by sputtering, or dip coating, followed by patterning by photolithography, and (ii) directly forming a film having an intended shape by a printing process, such as inkjet printing, nano printing, and gravure printing.

Formation of Gate Insulating Layer

The formation of a gate insulating layer is appropriately selected depending on the intended purpose without any limitation, provided that it is forming a gate insulating layer on the gate electrode, and examples thereof include: (i) forming a film by sputtering or dip coating, followed by patterning by photolithography; and (ii) directly forming a film having an intended shape by a printing process, such as inkjet printing, nano printing, and gravure printing.

—Formation of Source Electrode and Drain Electrode—

The formation of a source electrode and a drain electrode is appropriately selected depending on the intended purpose without any limitation, provided that it contains forming a source electrode and a drain electrode on the gate insulating layer in a manner that the source electrode and the drain electrode are apart from each other, and that the source electrode and the drain electrode are both formed by applying the coating liquid for forming an electroconductive thin film of the present invention, and are both formed of an electroconductive thin film.

The application (coating) method is appropriately selected depending on the intended purpose without any limitation, and examples thereof include screen printing, roll coating, dip coating, spin coating, inkjet printing, and nano printing.

When the coating is performed by inkjet printing or nano printing as the coating method, the coating can be performed at room temperature. However, the support (e.g., the gate insulating layer) is preferably heated to about 30° C. to about 100° C., the coating liquid for forming an electroconductive thin film just after deposited on a surface of the support can be prevented from wetting and spreading.

After the coating, drying and baking are preferably performed.

The drying is appropriately selected depending on the intended purpose without any limitation, provided that it is performed under the conditions by which volatile components on the coating liquid for forming an electroconductive thin film can be removed. Note that, it is not necessary to completely remove the volatile components during the drying, and the volatile components may be removed in an enough amount with which baking is not adversely affected.

The temperature of the baking is appropriately selected depending on the intended purpose without any limitation, provided that it is temperature equal to or higher than temperature at which the metal oxide (the metal oxide containing indium and thin), which is a main component of the electroconductive thin film, is formed, and equal to or lower than the deformation temperature of the support. The temperature of the baking is preferably 250° C. to 600° C.

The atmosphere for the baking is appropriately selected depending on the intended purpose without any limitation, and examples thereof include atmosphere including oxygen, such as in oxygen gas, and in atmosphere. Moreover, the atmosphere of the baking may be inert gas, such as nitrogen gas.

By performing an annealing treatment in the atmosphere, inert gas, or reducing gas after the baking, the electric properties, reliability, and uniformity of the electroconductive thin film can be further improved.

The duration for the baking is appropriately selected depending on the intended purpose without any limitation.

—Formation of Active Layer—

The formation of an active layer is appropriately selected depending on the intended purpose without any limitation, provided that it contains forming an active layer formed of oxide semiconductor in an area on the gate insulating layer which is a channel region between the source electrode and the drain electrode.

In the first production method, the order for performing the formation of a source electrode and a drain electrode, and the formation of an active layer is not restricted. The formation of an active layer may be performed after the formation of a source electrode and a drain electrode. Moreover, the formation of a source electrode and a drain electrode may be performed after the formation of an active layer.

When the formation of an active layer is performed after the formation of a source electrode and a drain electrode in the first production method, a bottom-gate and bottom-contact field-effect transistor can be produced.

When the formation of a source electrode and a drain electrode is performed after the formation of an active layer in the first production method, a bottom-gate and top-contact field-effect transistor can be produced.

A production method of a bottom-gate and bottom-contact field-effect transistor will be explained with reference to FIGS. 6A to 6D, hereinafter.

Figure 6A:
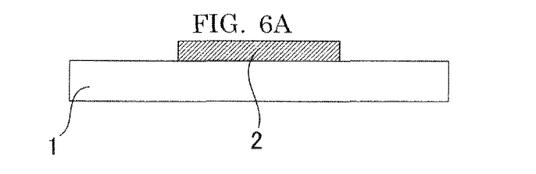
FIG. 6A is a schematic cross-sectional diagram illustrating one example of the method for producing a field-effect transistor of the present invention (part 1).

First, an electroconductive film (e.g. aluminum) is formed on a substrate 1 (e.g., a glass substrate) by sputtering, and the formed electroconductive film is patterned by etching to thereby form a gate electrode 2 (FIG. 6A).

Figure 6B:
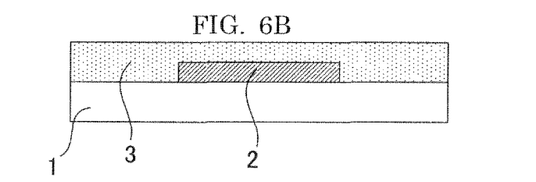
FIG. 6B is a schematic cross-sectional diagram illustrating one example of the method for producing a field-effect transistor of the present invention (part 2).

Next, a gate insulating layer 3 (e.g., $SiO_2$) is formed on the gate electrode 2 and the substrate 1 by sputtering to over the gate electrode 2 with the gate insulating layer 3 (FIG. 6B).

Figure 6C:
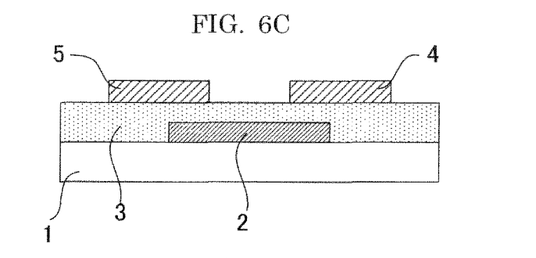
FIG. 6C is a schematic cross-sectional diagram illustrating one example of the method for producing a field-effect transistor of the present invention (part 3).

The coating liquid for forming an electroconductive thin film is then applied onto the gate insulating layer 3, for example, by inkjet printing, and the applied coating liquid is subjected to a heat treatment, to thereby form a source electrode 4 and drain electrode 5 both formed of an electroconductive thin film (FIG. 6C).

Figure 6D:
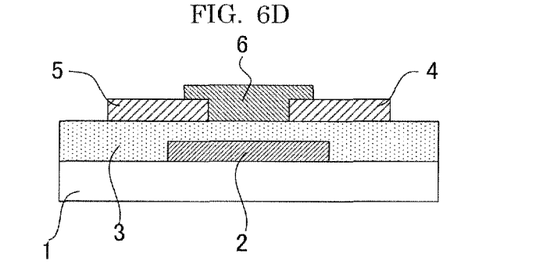
FIG. 6D is a schematic cross-sectional diagram illustrating one example of the method for producing a field-effect transistor of the present invention (part 4).

Next, an oxide semiconductor film (e.g., In—Zn oxide semiconductor) was formed on the gate insulating layer 3 by sputtering so as to cover a channel region formed between the source electrode 4 and the drain electrode 5, and the formed oxide semiconductor film is patterned by etching to thereby form an active layer 6 (FIG. 6D).

In the manner as described above, a field-effect transistor is produced.

<Second Production Method>

The second production method will be explained hereinafter.

—Substrate—

The substrate is appropriately selected depending on the intended purpose without any limitation, and examples thereof include those substrates listed as examples in the first production method.

—Formation of Source Electrode and Drain Electrode—

The formation of a source electrode and a drain electrode is appropriately selected depending on the intended purpose without any limitation, provided that it contains forming a source electrode and a drain electrode on the substrate in a manner that the source electrode and the drain electrode are apart from each other, and that the source electrode and the drain electrode are both formed by applying the coating liquid for forming an electroconductive thin film of the present invention, and are both formed of an electroconductive thin film. Examples of a process thereof include those as listed in the formation of a source electrode and a drain electrode in the first production method.

—Formation of Active Layer—

The formation of an active layer is appropriately selected depending on the intended purpose without any limitation, provided that it contains forming an active layer formed of oxide semiconductor in an area on the substrate which is a channel region between the source electrode and the drain electrode.

—Formation of Gate Insulating Layer—

The formation of a gate insulating layer is appropriately selected depending on the intended purpose without any limitation, provided that it contains forming a gate insulating layer on the active layer, and examples of a process thereof include those as listed in the formation of a gate insulating layer in the first production method.

—Formation of Gate Electrode—

The formation of a gate electrode is appropriately selected depending on the intended purpose without any limitation, provided that it contains forming a gate electrode on the gate insulating layer, and examples of a process thereof include those as listed in the formation of a gate electrode in the first production method.

In the second production method, the order for performing the formation of a source electrode and a drain electrode, and the formation of an active layer is not restricted. The formation of an active layer may be performed after the formation of a source electrode and a drain electrode. Moreover, the formation of a source electrode and a drain electrode may be performed after the formation of an active layer.

When the formation of an active layer is performed after the formation of a source electrode and a drain electrode in the second production method, a top-gate and bottom-contact field-effect transistor can be produced.

When the formation of a source electrode and a drain electrode is performed after the formation of an active layer in the second production method, a top-gate and top-contact field-effect transistor can be produced.

EXAMPLES

Examples of the present invention will be explained hereinafter, but Examples below shall not be construed to as limit the scope of the present invention in any way.

Examples 1 to 5 and Comparative Examples 1 to 2

Preparation of Coating Liquid for Forming an Electroconductive Thin Film

A coating liquid for forming an electroconductive thin film was prepared by mixing and stirring a commercially available ITO nanoparticle dispersion liquid (of Tomoe Works Co., Ltd., average particle diameter: 20 nm, metal content: 10.1% by mass) and gold nanometal ink (Au-1Cden, manufactured by ULVAC Materials Co., Ltd., average particle diameter: 5 nm, metal content: 51% by mass). The ITO nanoparticle dispersion liquid and the gold metal ink were mixed to have a blending ratio of indium tin oxide (ITO) and gold as depicted in Table 1. Note that, the blending ratio was remained the same in the formed electroconductive thin film, and the ratio of the numbers of atoms thereof was as depicted in Table 1.

electrode of which are both formed of an electroconductive thin film and the horizontal axis is the ratio of the number of Au atoms. The dotted line and the dashed-dotted line indicate acceptable values of the volume resistivity of an electroconductive thin film and the on-state current of a field-effect transistor, which are described below. When the electroconductive thin film of the present invention is used for a source electrode and a drain electrode, the volume resistivity thereof is preferably 1.0E-3 $\Omega$cm or less, more preferably 2.0E-4 $\Omega$cm or less. Also, the on-state current of a field-effect transistor using the electroconductive thin film of the present invention is preferably 1.0E-4 A or more, more preferably 1.5E-4 A or more.

<Production of Electroconductive Thin Film>

The obtained coating liquid for forming an electroconductive thin film was applied onto a glass substrate by means of an inkjet device. The glass substrate, on which the coating liquid for forming an electroconductive thin film had been applied, was heated for 10 minutes on a hot plate of 120° C., followed by heated for 1 hour at 300° C. in the atmosphere, to thereby form a linear electroconductive thin film having the average length of 4 mm, average width of 50 μm, and average thickness of 100 nm.

<Production of Field-Effect Transistor>

—Formation of Gate Electrode—

On a glass substrate a molybdenum film was formed by DC sputtering to give a thickness of about 100 nm. Thereafter, a photoresist was applied thereon, and the applied photoresist was subjected to pre-baking, exposure by an exposing device, and then developing, to thereby form a resist pattern having the same pattern as a gate electrode to be formed. Further, etching was performed using an etching liquid formed of a mixture of phosphoric acid, nitric acid, and acetic acid, to thereby remove the area of the molybdenum film where the resist pattern was not formed. Thereafter, the resist pattern is removed, to thereby form a gate electrode.

—Formation of Gate Insulating Layer—

On the formed gate electrode and the glass substrate, an $SiO_2$ film was formed by RF sputtering to give a thickness

TABLE 1

| | Blending ratio | | Ratio of numbers of atoms | | | | | Volume | On-state |
|---|---|---|---|---|---|---|---|---|---|
| | ITO (parts by mass) | Au (parts by mass) | In(A) (%) | Sn(B) (%) | Au(C) (%) | Sn/In | (C)/[(A) + (B) + (C)] | resistivity ($\Omega$cm) | current (A) |
| Comp. Ex. 1 | 0.675 | 0 | 95.1 | 4.9 | 0 | 0.06 | 0 | 1.50E-01 | 3.90E-05 |
| Ex. 1 | 0.675 | 0.063 | 74.7 | 3.9 | 21.4 | 0.05 | 0.21 | 8.00E-04 | 1.50E-04 |
| Ex. 2 | 0.627 | 0.083 | 68.5 | 3.6 | 27.9 | 0.05 | 0.28 | 2.00E-04 | 2.20E-04 |
| Ex. 3 | 0.627 | 0.143 | 57.1 | 3.0 | 39.9 | 0.05 | 0.40 | 1.50E-04 | 2.35E-04 |
| Ex. 4 | 0.482 | 0.255 | 37.4 | 1.9 | 60.7 | 0.05 | 0.61 | 1.00E-04 | 2.40E-04 |
| Ex. 5 | 0.289 | 0.357 | 20.6 | 1.1 | 78.3 | 0.05 | 0.78 | 9.00E-05 | 1.40E-04 |
| Comp. Ex. 2 | 0 | 0.800 | 0 | 0 | 100 | — | 1.00 | 1.00E-05 | 4.30E-05 |

Figure 7A:
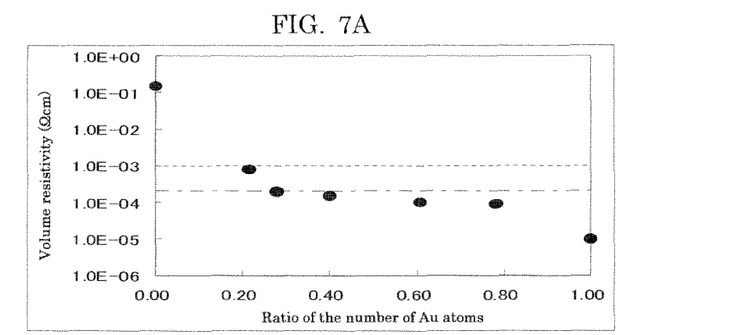
FIG. 7A is a graph of results obtained in Examples (part 1).
Figure 7B:
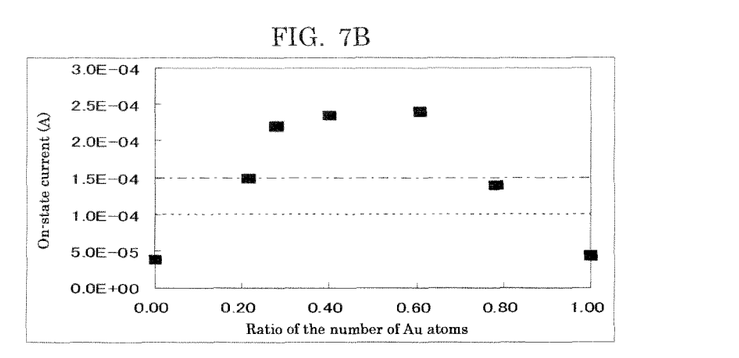
FIG. 7B is a graph of results obtained in Examples (part 2).

Note that, in Table 1, and FIGS. 7A and 7B, E denotes "the exponent of 10." For example, "1.0E-01" represents "0.1," and "1.0E-05" represents "0.00001."

The values in Table 1 were plotted on a graph of FIG. 7A where the vertical axis is the volume resistivity ($\Omega$cm) of an electroconductive thin film and the horizontal axis is the ratio of the number of Au atoms. Also, they were plotted on a graph of FIG. 7B where the vertical axis is the on-state current (A) of a transistor the source electrode and drain of about 200 nm. Thereafter, a photoresist was applied thereon, and the applied photoresist was subjected to pre-baking, exposure by an exposing device, and then developing, to thereby form a resist pattern having the same pattern as a gate insulating layer to be formed. Further, etching was performed using an etching liquid using buffered hydrofluoric acid, to thereby remove the area of the $SiO_2$ film where the resist pattern was not formed. Thereafter, the resist pattern is removed, to thereby form a gate insulating layer.

—Formation of Active Layer—

On the formed gate insulating layer, an In—Mg oxide thin film (average thickness: 50 nm), which would form an active layer, was formed by RF sputtering in accordance with the method described in the paragraphs [0074] to [0075] of JP-A No. 2010-74148.

—Formation of Source Electrode and Drain Electrode—

Onto the formed active layer, the prepared coating liquid for forming an electroconductive thin film was applied by means of an inkjet device to give an intended pattern. The resultant was heated for 10 minutes on a hot plate heated at 120° C., followed by heated for 1 hour at 300° C. in the atmosphere, to thereby form a source electrode and drain electrode both formed of the electroconductive thin film of the present invention. Note that, a channel width specified with the source electrode width was set to 400 μm, and a channel length specified with a space between the source electrode and the drain electrode was set to 50 m.

In the manner as mentioned, a field-effect transistor was produced.

<Evaluation>

—Volume Resistivity—

The volume resistivity of each of the obtained electroconductive thin films was measured by means of a semiconductor parameter analyzer 4200SCS, manufactured by Keithley Instruments Inc. The electric current when voltage changing from −1V to +1V or from +1V to −1 V was applied at the edge of the electroconductive thin film having the length of 4 mm in the lengthwise direction was measured by a two-terminal method, to thereby measure the volume resistivity of the electroconductive thin film. The results are presented in Table 1.

It was found from Table 1 that the volume resistivity of the electroconductive thin film was significantly reduced when the ratio [C/(A+B+C)] was 0.21 or greater. This was probably because electroconductivity of the gold started to work dominantly over the electric resistance of the electroconductive thin film as a result that the concentration of the gold in the electroconductive thin film exceeded the percolation threshold, and therefore the resistivity of the electroconductive thin film was reduced as a whole.

—FET On-State Current—

The current run between the source and drain (on-state current) Ids of each of the obtained field-effect transistors was measured by means of the semiconductor parameter analyzer in which the source-drain voltage Vds was set at 20 V, and the voltage Vgs was set at 30 V. The results are presented in Table 1.

It was found from Table 1 that the on-state current was significantly reduced when the ratio [C/(A+B+C)] was greater than 0.78. This was probably because that contact resistance between the electrode and the oxide semiconductor increased as the gold occupied the majority of the surfaces of the source electrode and drain electrode, and therefore the current-voltage properties were deteriorated.

As is clear from the graph of FIG. 7B, when the ratio [C/(A+B+C)] is 0.21 or greater but 0.78 or less, high on-state current is observed in the FETs using the electroconductive thin film of the present invention for their source electrode and drain electrode. And, when the ratio [C/(A+B+C)] is 0.28 or greater but 0.61 or less, higher on-state current is observed. That is, the graphs of FIGS. 7A and 7B indicate that favorable device performances can be obtained by applying the electroconductive thin film of the present invention to a source electrode and a drain electrode of FETs using oxide semiconductor.

The embodiments of the present invention are, for example, as follows:

<1> An electroconductive thin film, containing:
a metal oxide containing indium and tin; and gold.

<2> The electroconductive thin film according to <1>, wherein a number (A) of atoms of the indium, a number (B) of atoms of the tin, and a number (C) of atoms of the gold satisfy the following formula (1):

$$0.21 \leq [C/(A+B+C)] \leq 0.78 \quad \text{Formula (1)}$$

<3> The electroconductive thin film according to <1> or <2>, wherein the electroconductive thin film is formed by a method containing:
applying, onto a support, a coating liquid for forming an electroconductive film, which contains gold, and a combination of indium and tin, a metal oxide containing indium and tin, a combination of indium oxide and tin oxide, or any combination thereof;
drying the applied coating liquid; and
baking the dried coating liquid.

<4> A coating liquid for forming an electroconductive thin film, containing:
a combination of indium and tin, a metal oxide containing indium and tin, a combination of indium oxide and tin oxide, or any combination thereof, and
gold.

<5> The coating liquid according to <4>, wherein a number (A) of atoms of the indium, a number (B) of atoms of the tin, and a number (C) of atoms of the gold satisfy the following formula (1):

$$0.21 \leq [C/(A+B+C)] \leq 0.78 \quad \text{Formula (1)}$$

<6> A field-effect transistor, containing:
a gate electrode configured to apply gate voltage;
a source electrode and a drain electrode, both configured to extract electric current;
an active layer, which is formed of oxide semiconductor, and is formed between the source electrode and the drain electrode; and
a gate insulating layer formed between the gate electrode and the active layer,
wherein the source electrode and the drain electrode are both formed of the electroconductive thin film according to any one of <1> to <3>.

<7> A method for producing a field-effect transistor, containing:
forming a gate electrode on a substrate;
forming a gate insulating layer on the gate electrode;
forming, on the gate insulating layer, a source electrode and a drain electrode in a manner that the source electrode and the drain electrode are apart from each other, where both the source electrode and the drain electrode are formed of an electroconductive thin film; and
forming an active layer formed of oxide semiconductor in an area on the gate insulating layer which is a channel region between the source electrode and the drain electrode,
wherein the forming the source electrode and the drain electrode contains applying the coating liquid for forming an electroconductive thin film according to <4> or <5> to form the source electrode and the drain electrode both formed of the electroconductive thin film.

<8> A method for producing a field-effect transistor, containing:
forming, on a substrate, a source electrode and a drain electrode in a manner that the source electrode and the drain electrode are apart from each other;

forming an active layer formed of oxide semiconductor in an area on the substrate which is a channel region between the source electrode and the drain electrode;

forming a gate insulating layer on the active layer; and forming a gate electrode on the gate insulating layer, wherein the forming the source electrode and the drain electrode contains applying the coating liquid for forming an electroconductive thin film according to <4> or <5> to form the source electrode and the drain electrode both formed of the electroconductive thin film.

REFERENCE SIGNS LIST

1: substrate
2: gate electrode
3: gate insulating layer
4: source electrode
5: drain electrode
6: active layer

The invention claimed is:

1. A field-effect transistor, comprising:
an n-type oxide film; and
an electroconductive film in contact with the n-type oxide film of the field-effect transistor, the electroconductive film comprising:
a metal oxide containing indium and tin; and
gold particles,
wherein a number (A) of atoms of the indium, a number (B) of atoms of the tin, and a number (C) of atoms of the gold satisfy the following formula (1):

$$0.28 \leq [C/(A+B+C)] \leq 0.61 \qquad \text{Formula (1), and}$$

wherein in the electroconductive film including the metal oxide and the gold particles, the metal oxide is constituted by metal oxide particles having an average particle diameter in a range of 10 nm to 100 nm, and the gold particles are external to the metal oxide particles and have an average particle diameter in a range of 10 nm to 100 nm, and the metal oxide particles and the gold particles external to the metal oxide particles are in contact with each other within the electroconductive film, and wherein the gold particles external to the metal oxide particles and having the average particle diameter in the range of 10 nm to 100 nm are in contact with each other throughout the electroconductive film to form a network of the interconnected gold particles, and wherein a surface of the electroconductive film is in contact with the n-type oxide film, and the gold particles and the metal oxide particles are present on said surface of the electroconductive film, and the gold particles present on said surface of the electroconductive film are in contact with the n-type oxide film.

2. The field-effect transistor according to claim 1, wherein the electroconductive film is formed by a method containing:
applying, onto a support, a coating liquid for forming an electroconductive film, which contains gold, and a combination of indium and tin, a metal oxide containing indium and tin, a combination of indium oxide and tin oxide, or any combination thereof;
drying the applied coating liquid; and
baking the dried coating liquid.

3. A coating liquid for forming an electroconductive film in contact with an n-type oxide film of a field-effect transistor, comprising:

a combination of indium and tin, a metal oxide containing indium and tin, a combination of indium oxide and tin oxide, or any combination thereof;
gold particles; and
an organic solvent,
wherein a number (A) of atoms of the indium, a number (B) of atoms of the tin, and a number (C) of atoms of the gold satisfy the following formula (1):

$$0.28 \leq [C/(A+B+C)] \leq 0.61 \qquad \text{Formula (1), and}$$

wherein in the electroconductive film including the metal oxide and the gold particles, the metal oxide is constituted by metal oxide particles having an average particle diameter in a range of 10 nm to 100 nm, and the gold particles are external to the metal oxide particles and have an average particle diameter in a range of 10 nm to 100 nm, and the metal oxide particles and the gold particles external to the metal oxide particles are in contact with each other within the electroconductive film, and wherein the gold particles external to the metal oxide particles and having the average particle diameter in the range of 10 nm to 100 nm are in contact with each other throughout the electroconductive film to form a network of the interconnected gold particles, and wherein a surface of the electroconductive film is in contact with the n-type oxide film, and the gold particles and the metal oxide particles are present on said surface of the electroconductive film, and the gold particles present on said surface of the electroconductive film are in contact with the n-type oxide film.

4. The field-effect transistor according to claim 1, further comprising:
a gate electrode configured to apply gate voltage;
a source electrode and a drain electrode, both configured to extract electric current;
an active layer, which is formed of oxide semiconductor, and is formed between the source electrode and the drain electrode; and
a gate insulating layer formed between the gate electrode and the active layer,
wherein at least one of the source electrode and the drain electrode is formed of the electroconductive film.

5. An electroconductive film in contact with an n-type oxide film, comprising:
a metal oxide containing indium and tin; and
gold particles,
wherein a number (A) of atoms of the indium, a number (B) of atoms of the tin, and a number (C) of atoms of the gold satisfy the following formula (1):

$$0.21 \leq [C/(A+B+C)] \leq 0.78 \qquad \text{Formula (1), and}$$

wherein in the electroconductive film including the metal oxide and the gold particles, the metal oxide is constituted by metal oxide particles having an average particle diameter in a range of 10 nm to 100 nm, and the gold particles are external to the metal oxide particles and have an average particle diameter in a range of 10 nm to 100 nm, and the metal oxide particles and the gold particles external to the metal oxide particles are in contact with each other within the electroconductive film, and wherein the gold particles external to the metal oxide particles and having the average particle diameter in the range of 10 nm to 100 nm are in contact with each other throughout the electroconductive film to form a network of the interconnected gold particles, and wherein a surface of the electroconductive film is in contact with the n-type oxide film, and the gold particles and the metal oxide particles are present on said surface of the electroconductive film, and the gold particles present on said surface of the electroconductive film are in contact with the n-type oxide film.

* * * * *